(12) United States Patent
Wang et al.

(10) Patent No.: US 11,926,523 B2
(45) Date of Patent: Mar. 12, 2024

(54) MICROFABRICATION OF OMNI-VIEW PERIPHERAL SCANNING SYSTEM

(71) Applicant: BEIJING VOYAGER TECHNOLOGY CO., LTD., Beijing (CN)

(72) Inventors: Youmin Wang, Berkeley, CA (US); Yue Lu, Mountain View, CA (US)

(73) Assignee: BEIJING VOYAGER TECHNOLOGY CO., LTD., Beijing (CN)

(*) Notice: Subject to any disclaimer, the term of this patent is extended or adjusted under 35 U.S.C. 154(b) by 296 days.

(21) Appl. No.: 17/470,236

(22) Filed: Sep. 9, 2021

(65) Prior Publication Data

US 2023/0072948 A1  Mar. 9, 2023

(51) Int. Cl.
| | |
|---|---|
| *B81C 1/00* | (2006.01) |
| *G02B 26/08* | (2006.01) |
| *G02B 26/10* | (2006.01) |
| *G01S 7/481* | (2006.01) |

(52) U.S. Cl.
CPC ...... *B81C 1/00174* (2013.01); *G02B 26/0833* (2013.01); *G02B 26/10* (2013.01); *B81C 2201/0142* (2013.01); *B81C 2201/0181* (2013.01); *B81C 2203/032* (2013.01); *G01S 7/4817* (2013.01)

(58) Field of Classification Search
None
See application file for complete search history.

(56) References Cited

U.S. PATENT DOCUMENTS

| | | | |
|---|---|---|---|
| 11,614,518 B2* | 3/2023 | Wang | G01S 17/42 |
| | | | 356/4.01 |
| 2006/0274397 A1* | 12/2006 | Yang | G02B 26/0841 |
| | | | 359/245 |
| 2019/0293923 A1* | 9/2019 | Ghahremani | B81B 7/0067 |
| 2020/0209615 A1* | 7/2020 | Lee | B81C 1/00404 |
| 2022/0204338 A1* | 6/2022 | Lee | B81B 3/0072 |
| 2022/0229161 A1* | 7/2022 | Kahana | G01S 7/4817 |
| 2023/0072722 A1* | 3/2023 | Bozhevolnyi | G02B 5/008 |

* cited by examiner

*Primary Examiner* — Shamim Ahmed
(74) *Attorney, Agent, or Firm* — BAYES PLLC

(57) ABSTRACT

Embodiments of the disclosure provide methods for microfabricating an omni-view peripheral scanning system. One exemplary method may include separately fabricating a reflector and a scanning MEMS mirror, and then bonding the microfabricated reflector with the scanning MEMS mirror to form the omni-view peripheral scanning system. The microfabricated reflector may include a cone-shaped bottom portion, and a via hole across the cone-shaped bottom portion. The microfabricated scanning MEMS mirror may include a MEMS actuation platform and a scanning mirror supported by the MEMS actuation platform. The scanning MEMS mirror may face the cone-shaped bottom portion of the reflector when forming the omni-view peripheral scanning system.

20 Claims, 6 Drawing Sheets

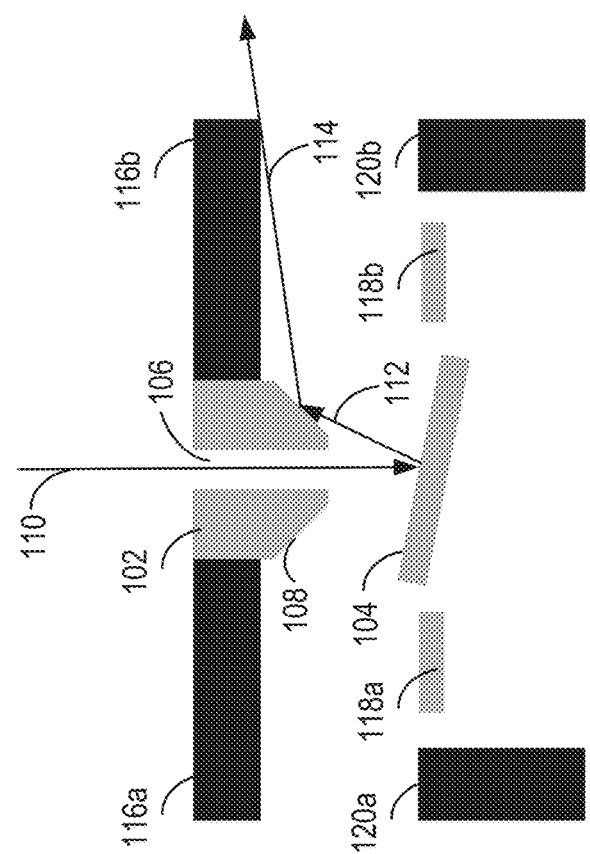

MICROFABRICATION OF OMNI-VIEW PERIPHERAL SCANNING SYSTEM

CROSS-REFERENCE TO RELATED APPLICATIONS

This application is related to U.S. application Ser. No. 17/470,039, filed on Sep. 9, 2021, entitled "OMNI-VIEW PERIPHERAL SCANNING SYSTEM WITH INTEGRATED MEMS SPIRAL SCANNER," the entire content of which is incorporated herein by reference.

TECHNICAL FIELD

The disclosure relates to manufacturing components for a light detection and ranging (LiDAR) system, and more particularly to, a method for microfabricating an omni-view peripheral scanning system in LiDAR applications.

BACKGROUND

In a LiDAR system mounted on a certain vehicle (e.g., a robotaxi), it is usually beneficial to have a 360-degree horizontal field of view, so as to detect objects in all directions surrounding the vehicle. However, this could be challenging for current scanning-based solid-state LiDAR systems, as most of the scanners in these LiDAR systems cannot scan with a field of view larger than 120 degrees, not even to mention 360 degrees. To achieve a 360-degree horizontal field of view, a vehicle needs to mount multiple LiDAR units on the vehicle. This unavoidably adds complexity, cost, and alignment issues to the sensing system used by the vehicle.

Embodiments of the disclosure address the above problems by providing methods for microfabricating an omni-view peripheral scanning system in LiDAR applications.

SUMMARY

Embodiments of the disclosure provide a method for making an omni-view peripheral scanning system. The method includes fabricating a reflector using a first microfabrication process, where the reflector includes a cone-shaped bottom portion, and a via hole across the cone-shaped bottom portion. The method further includes constructing a scanning micro-electro-mechanical systems (MEMS) mirror, where the scanning MEMS mirror comprises a MEMS actuation platform and a scanning mirror supported by the MEMS actuation platform. The method additionally includes bonding the reflector on top of the scanning MEMS mirror such that the scanning MEMS mirror faces the cone-shaped bottom portion to form the omni-view peripheral scanning system.

Embodiments of the disclosure further provide a method for making an optical sensing system with an omni-view peripheral scanning system in an optical sensing system. The method includes constructing the omni-view peripheral scanning system including a reflector bonded on top of a scanning MEMS mirror, where the scanning MEMS mirror includes a MEMS actuation platform and a scanning mirror supported by the MEMS actuation platform. The method additionally includes coupling the MEMS actuation platform to a controller for controlling a voltage differential to be applied to each of a plurality of comb drive actuators in the MEMS actuation platform.

It is to be understood that both the foregoing general description and the following detailed description are exemplary and explanatory only and are not restrictive of the disclosure, as claimed.

BRIEF DESCRIPTION OF THE DRAWINGS

FIG. 1 illustrates a schematic diagram of an exemplary omni-view peripheral scanning system, according to embodiments of the disclosure.

DETAILED DESCRIPTION

Figure 2B:
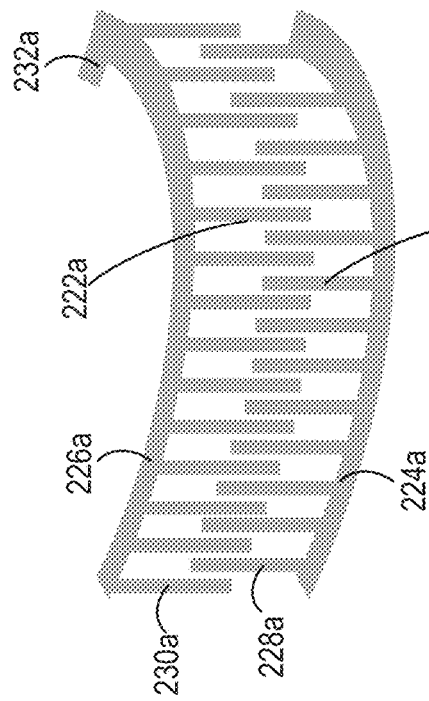
FIG. 2B illustrates a schematic diagram of an exemplary circular vertical comb drive actuator, according to embodiments of the disclosure.

Reference will now be made in detail to the exemplary embodiments, examples of which are illustrated in the accompanying drawings. Wherever possible, the same reference numbers will be used throughout the drawings to refer to the same or like parts.

Embodiments of the disclosure provide an exemplary method for microfabricating an omni-view peripheral scanning system. The method may include separately fabricating a reflector and a scanning MEMS mirror, and then bonding the microfabricated reflector with the scanning MEMS mirror to form the omni-view peripheral scanning system. The microfabricated reflector may include a top column portion, a cone-shaped bottom portion, and a via hole across the top column portion and the cone-shaped bottom portion. The microfabricated scanning MEMS mirror may include a MEMS actuation platform and a scanning mirror supported by the MEMS actuation platform. The scanning MEMS mirror may face the cone-shaped bottom portion of the reflector when forming the omni-view peripheral scanning system.

Embodiments of the disclosure also provide an exemplary method for making an optical sensing system contained an omni-view peripheral scanning system. For instance, to make such an optical sensing system, a controller may be further coupled to a scanning MEMS mirror, or more specifically, coupled to a set of circular vertical comb drive actuators in the MEMS actuation platform. The controller may control the scanning MEMS mirror to reflect laser beams following a specific pattern (e.g., a spiral pattern) when reflected laser beams reach the cone-shaped bottom portion of the reflector. The cone-shaped bottom portion of the reflector may then reflect the laser beams towards the environment following a peripheral scanning pattern.

As can be seen, the as-constructed omni-view peripheral scanning system may allow scanning of the environment surrounding an optical sensing system to achieve up to a 360-degree horizontal field of view by a single LiDAR unit without requiring multiple LiDAR units. This saves the cost and simplifies the configuration including the alignment issues faced by the optical sensing system of a vehicle.

The features and advantages described herein are not all-inclusive and many additional features and advantages will be apparent to one of ordinary skill in the art in view of the figures and the following descriptions.

FIG. 1 illustrates a cross-section view of an exemplary omni-view peripheral scanning system 100, according to embodiments of the disclosure. As illustrated in FIG. 1, an omni-view peripheral scanning system 100 may include a top reflector 102 and a scanning mirror 104. Top reflector 102 may further include a via hole 106 along a central axis of top reflector 102. In addition, top reflector 102 may include a cone-shaped reflecting surface 108 that faces scanning mirror 104. In some embodiments, top reflector 102 may be fixed to anchors 116a and 116b, which may be implemented as separate pieces as illustrated in FIG. 1, or may be implemented as a single piece. Scanning mirror 104 may be a movable mirror that can be tilted to different normal directions in three-dimension (3D) at any moment during a scanning process. The movement of scanning mirror 104 may be controlled by a set of vertical circular comb drive actuators 118a and 118b, or by other controlling mechanisms. Similarly, comb drive actuators 118a and 118b may be also mounted onto anchors 120a and 120b, respectively. Anchors 120a and 120b may also be implemented as separate pieces as illustrated in FIG. 1, or may be implemented as a single piece.

In one example, during a scanning process, a laser beam 110 may pass through via hole 106 and reach the top surface of scanning mirror 104. Scanning mirror 104 may be tilted to a certain normal direction (i.e., a direction perpendicular to a plane of the scanning mirror surface) when laser beam 110 reaches the top surface of scanning mirror 104, and thus reflect laser beam 110 at a certain angle and direction with respect to incident laser beam 110, e.g., as a laser beam 112 as shown in FIG. 1. Reflected laser beam 112 may reach cone-shaped reflecting surface 108, which may further reflect the reflected laser beam 112 towards the environment, e.g., as a laser beam 116 as shown in FIG. 1. In some embodiments, scanning mirror 104 may be tilted to different normal directions in 3D at different moments, and thus laser beam 112 may reach different parts of cone-shaped reflecting surface 108. When scanning mirror 104 is continuously tilted according to a certain pattern, laser beams 112 may continuously reach cone-shaped reflecting surface 108 in a specific pattern, e.g., in a spiral pattern that runs from bottom to top (or from top to bottom) of cone-shaped reflecting surface 108.

In some embodiments, top reflector 102 may be fixed to anchors 116a and 116b that hold a partial or full portion of top reflector 102 other than cone-shaped reflecting surface 108, as illustrated in FIG. 1. In some embodiments, when top reflector 102 is fixed to anchors 116a and 116b, via hole 106 of top reflector 102 may be aligned with incoming optical signals (e.g., laser beam 110), such that optical signals can pass through via hole 106 towards scanning mirror 104. For instance, via hole 106 may be aligned with laser beam 110 collimated by optics in a transmitter of a LiDAR system.

In some embodiments, the cross-section of via hole 106 of top reflector 102, in a direction perpendicular to the via hole 106, may be in different shapes, such as circular, ellipse, square, rectangular, or the like. In some embodiments, the size of via hole 106 may be large enough to allow collimated optical signals to pass through via hole 106. In some embodiments, the size of via hole 106 may be as small as possible so that more area on cone-shaped reflecting surface 108 will be available for reflecting optical signals towards the environment.

In some embodiments, the cone shape of cone-shaped reflecting surface 108 may have a fixed apex angle. For instance, the apex angle of cone-shaped reflecting surface 108 may be any angle between 0° and 90°, such as 10°, 15°, 20°, 25°, 30°, 35°, 40°, 45°, 50°, 55°, 60°, 65°, 70°, 75°, 80°, etc. In some embodiments, a smaller apex angle may be used by a LiDAR system with a focus on scanning areas that have a larger distance, while a larger apex angle may be used by a LiDAR system with a focus on scanning areas that have a smaller distance from the LiDAR system.

In some embodiments, the apex angle and height of the cone shape of cone-shaped reflecting surface 108 may be adjustable. For instance, in some embodiments, the top portion (may be referred to as "top column portion") and the cone portion (may be referred to as "cone-shaped bottom portion") of top reflector 102 may be separate pieces that are slidably connected and may operate in an "umbrella" style. That is, when the top column portion of top reflector 102 is pushed towards or pulled away from the cone-shaped bottom portion, the apex angle may change accordingly, which then causes the scanning area of disclosed omni-view peripheral scanning system to change consequentially. This may in turn allow the scanning area of the disclosed omni-view peripheral scanning system to be dynamically adjusted. For instance, when a vehicle with the disclosed omni-view peripheral scanning system moves to an urban area, top reflector 102 in the omni-view peripheral scanning system may increase its apex angle (e.g., by "pushing" the top column portion towards the cone-shaped bottom portion), so that the scanning is more focused on the areas close to the vehicle. On the other hand, if the vehicle moves to a rural area, top reflector 102 in the omni-view peripheral scanning system may decrease its apex angle (e.g., by "pulling" the top portion away from the cone portion), so that the scanning is more focused on the areas that are further away from the vehicle.

In some embodiments, the top column portion and the cone-shaped bottom portion of top reflector 102 may be an integrated part that is not separable. For instance, the top-column portion and the cone-shaped bottom portion of top-reflector 102 may be a single piece that is fabricated through one or more etching processes, as further described in FIG. 3. In some embodiments, the top column portion of top reflector 102 may be an integrated part of anchor 116a/116b, and thus there is not a separate top column portion of top reflector 102. In some embodiments, the cone-shaped bottom portion of top reflector 102, the top column portion of top reflector 102, anchor 116a/116b all together may be an integrated piece that is formed through a series of etching processes and/or other microfabrication processes.

In some embodiments, cone-shaped reflecting surface 108 may include a layer of reflecting material for reflecting optical signals. The coated reflecting material on cone-shaped reflecting surface 108 may have a high reflectivity, e.g., over 95%, and may be a same material as or a different material from that used on top of scanning mirror 104. In one example, the coating reflecting material may be polished anodized aluminum, mylar, silver, nickel, chromium, etc. In some embodiments, various processes, such as sputtering or evaporation, may be used for depositing reflective materials on cone-shaped reflecting surface 108.

With respect to scanning mirror 104, it may also have different shapes, such as circular, ellipse, square, rectangular, or the like. In order not to waste any incident optical signals, the size of the top surface of scanning mirror 104 may be at least larger than the size of via hole 106. As previously described, the reflecting material on the top surface of scanning mirror 104 may be the same as or different from the material used on cone-shaped reflecting surface 108. In some embodiments, scanning mirror 104 may be mounted onto a platform containing a set of circular vertical comb drive actuators that actuate the motion of scanning mirror 104, as further described below with respect to FIGS. 2A-2C.

Figure 2C:
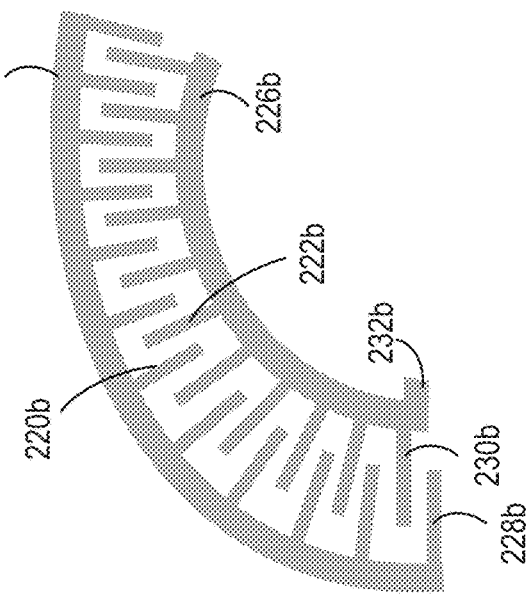
FIG. 2C illustrates a schematic diagram of another exemplary circular vertical comb drive actuator, according to embodiments of the disclosure.
Figure 2A:
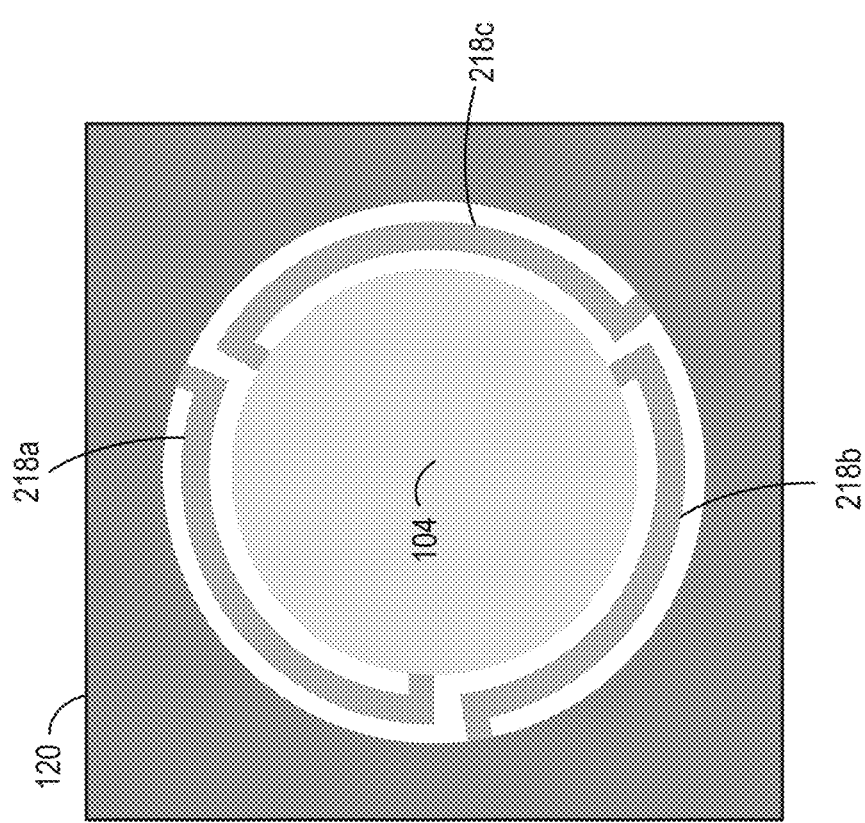
FIG. 2A illustrates a schematic diagram of an exemplary scanning MEMS mirror, according to embodiments of the disclosure.

FIG. 2A illustrates a schematic diagram of an exemplary scanning mirror 104 integrated onto a comb drive actuators-based platform, according to embodiments of the disclosure. In the illustrated embodiment, scanning mirror 104 may be a circular mirror, and there are three comb drive actuators that collaboratively control the motion of scanning mirror 104. It is to be noted that, while the MEMS actuators are described as the comb drive actuators in FIGS. 2A-2C and other parts of the specification, the disclosure is not limited to such actuation mechanism, and may include any other suitable actuation mechanisms for actuating the described vertical comb drives. These other MEMS actuation mechanisms may include electro-thermal, piezo-electric, and electro-magnetic actuation mechanisms, and the like.

As illustrated in FIG. 2A, scanning mirror 104 may be located at the center of the platform surrounded by three comb drive actuators 218a, 218b, and 218c (together or individually may be referred to as "comb drive actuator 218"). Each comb drive actuator 218 may include a stationary comb that is fixed to an anchor 120 and a movable comb that holds scanning mirror 104. According to one embodiment, a comb drive actuator 218 may be a vertical circular comb drive actuator as illustrated in FIG. 2B or FIG. 2C.

FIG. 2B illustrates an exemplary vertical circular comb drive actuator, according to embodiments of the disclosure. As illustrated, a vertical circular comb drive actuator may include an arc-shaped stationary comb 220a and an arc-shaped movable comb 222a. Each stationary comb 220a and movable comb 222a may include a respective circular-arm shaped anchor 224a and 226a and a respective set of teeth 228a and 230a that extend vertically (i.e., in a direction perpendicular to a plane of anchors 224a or 226a) and interleave with each other. Anchor 224a of stationary comb 220a may be an integral part of, or a separate component fixed to, anchor 120 that holds the whole platform including the three comb drive actuators 218. Anchor 226a of movable comb 222a may hold scanning mirror 104 at one point, e.g., at one end of anchor 226a through a beam 232a as shown in FIG. 2B. In some embodiments, each of the three vertical circular comb drive actuators 218a, 218b, and 218c may include such a beam 232a that holds scanning mirror 104 at one point, so that the three comb drive actuators together may hold scanning mirror 104 and control its movement. In some embodiments, although not specifically illustrated, each vertical circular comb drive actuator 218 may further include a different anchor that holds the respective movable comb through a spring beam. The spring beam may allow the respective movable comb to move at certain distances in a vertical direction (i.e., in a direction perpendicular to a plane of anchors 224a or 226a) but not in other directions.

In some embodiments, although not specifically illustrated, anchor 224a and anchor 226a may respectively electrically connect to a coupled anode or cathode, which together may apply a voltage differential to anchor 224a and anchor 226a. The applied voltage differential may drive movable comb 222a to move with respect to stationary comb 220a. The distance of the vertical movement of movable comb 222a may correspond to the value of the applied voltage differential. That is, a higher voltage differential between anchor 224a and anchor 226a may cause a larger vertical movement of movable comb 222a, and a smaller voltage differential causes a smaller vertical movement of movable comb 222a. In some embodiments, one or more controllers may be coupled to the three comb drive actuators to control the voltage differentials to be applied to these comb drive actuators.

In some embodiments, voltage differentials applied to different comb drive actuators and thus the vertical movements of the respective movable combs may be at different phases. For instance, each two adjacent comb drives may be controlled to have a phase difference. Accordingly, at any moment during a scanning process, the three movable combs may be at different distances away from the respective stationary combs, which thus causes the three beams 232a for holding scanning mirror 104 to be at different vertical levels (e.g., with respect to the stationary combs). This may then cause the plane of scanning mirror 104 to tilt to a certain normal direction at each moment of the scanning process. In some embodiments, depending on which movable comb(s) is at a higher level and which movable comb(s) is at a lower level, scanning mirror 104 may tilt towards different normal directions. In addition, by controlling the vertical movement distance of each movable comb, the tilted normal directions of scanning mirror 104 at different moments may be further controlled.

In some embodiments, other forms of vertical comb drive actuators are also possible and contemplated in the disclosure. FIG. 2C illustrates another exemplary vertical circular comb drive actuator, according to embodiments of the disclosure. The illustrated vertical circular comb drive actuator also includes a stationary comb 220b and a movable comb 222b, where stationary comb 220b may further include a stationary anchor 224b and a set of teeth 228b, and movable comb 222b may further include a movable anchor 226b and a set of teeth 230b. Movable anchor 226b may further include a beam 232b for holding scanning mirror 104.

Different from the circular vertical comb drive actuator illustrated in FIG. 2B, the circular vertical comb drive actuator illustrated in FIG. 2C has teeth that extend horizontally but not vertically. That is, the teeth for stationary comb 220b or movable comb 222b extend in a same plane as stationary anchor 224b or movable anchor 226b, but not in a direction perpendicular to a plane of stationary anchor 224b or movable anchor 226b as shown in FIG. 2B. To allow the movable comb 222b to move vertically with respect to the stationary comb 220b, capacitors for controlling the movements of movable comb 222b may be set differently from that for movable comb 222a shown in FIG. 2B.

It is to be noted that the vertical comb drive actuators shown in FIG. 2B and FIG. 2C are merely two exemplary comb drive actuators that control vertical movements of scanning mirror 104. Other forms of comb drive actuators (e.g., through comb drive actuators with a rotational axis that controls vertical movements of scanning mirror 104) or other controlling mechanisms that control the vertical movements of the scanning mirrors are also contemplated. In addition, four or more vertical comb drive actuators may be applied to control vertical movements of scanning mirror 104. In the following, exemplary processes for fabricating the comb drive actuators illustrated in FIG. 2B and FIG. 2C and top reflector 102 for forming an omni-view peripheral scanning system are further described.

Figure 3:
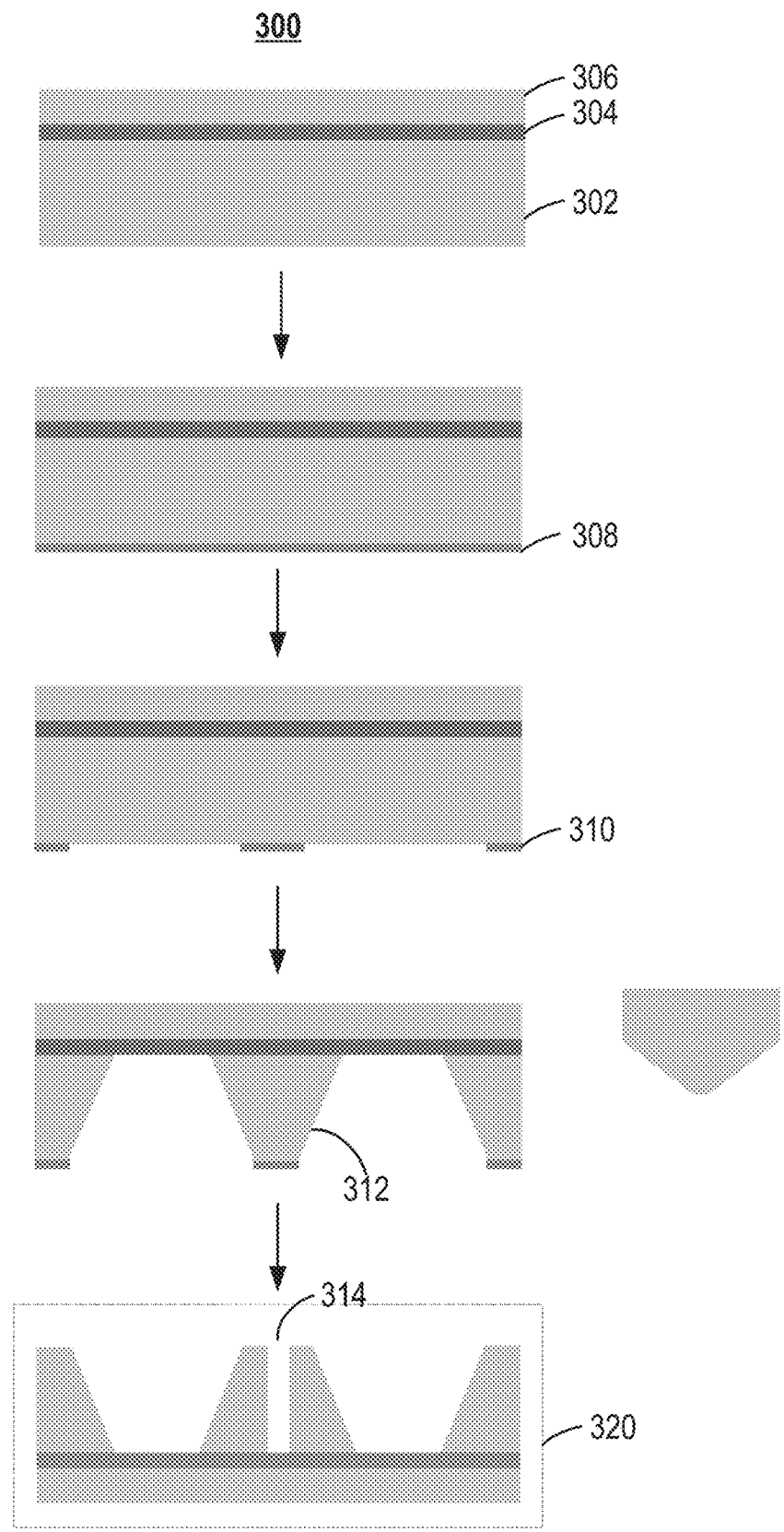
FIG. 3 illustrates a schematic diagram of an exemplary process for microfabricating a reflector, according to embodiments of the disclosure.
Figure 4:
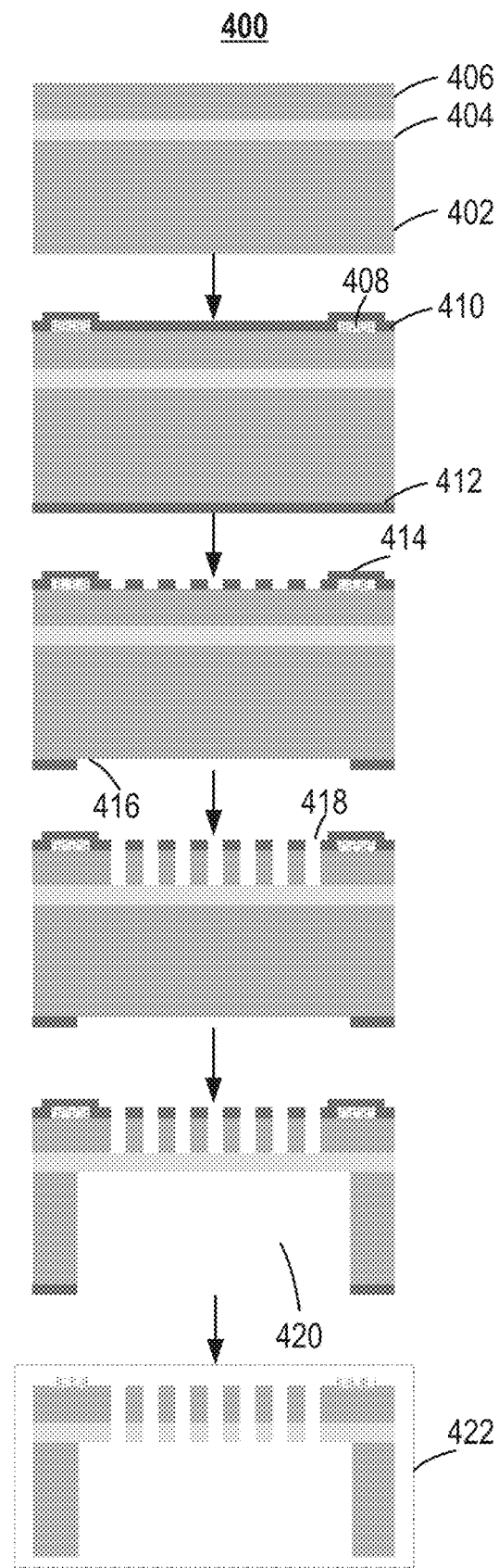
FIG. 4 illustrates a schematic diagram of an exemplary process for microfabricating a comb drive actuator-based platform main structure, according to embodiments of the disclosure.
Figure 5:
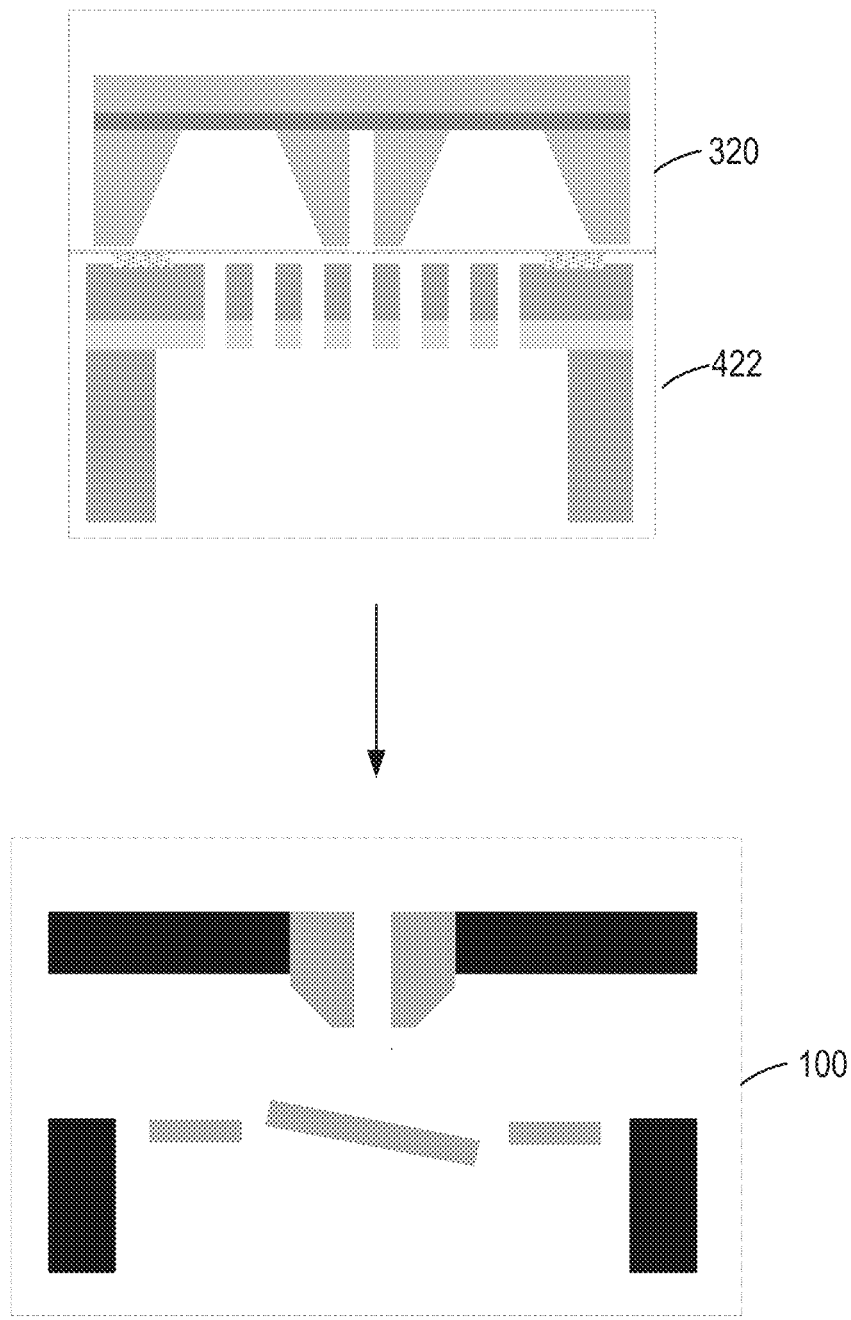
FIG. 5 illustrates a schematic diagram of an exemplary process for bonding a reflector with a comb drive actuator-based platform to form an omni-view peripheral scanning system, according to embodiments of the disclosure.

FIG. 3 illustrates a schematic diagram of an exemplary process 300 for microfabricating a top reflector, FIG. 4 illustrates a schematic diagram of an exemplary process 400 for microfabricating a circular vertical comb drive actuator-based platform, while FIG. 5 illustrates a schematic diagram of an exemplary process 500 for bonding a fabricated top reflector with a vertical comb drive actuator-based platform to form an omni-view peripheral scanning system, according to embodiments of the disclosure.

To fabricate a reflector (e.g., a top reflector 102), a silicon on insulator (SOI) wafer having three different layers may be prepared. As illustrated by FIG. 3, the three layers may include a bottom silicon substrate layer 302 (which may be also referred to as "handle layer"), a buried oxide (BOX) layer 304 in the middle, and a top active primer quality silicon device layer 306 (which may be also referred to as "device layer"). Depending on the configurations, the three layers 302, 304, and 306 may have different thicknesses. In one example, substrate layer 302 may have a thickness corresponding to the thickness of the reflector (e.g., top reflector 102), including its top column portion and bottom cone-shaped portion. According to non-limiting examples, device layer 306 may have a thickness of 10 μm, 20 μm, 30 μm, 40 μm, 50 μm, etc. BOX layer 304 may have a much smaller thickness, which may be 1 μm, 2 μm, 3 μm, 4 μm, 5 μm, etc.

Next, a thin (e.g., 0.25 μm, 0.5 μm, 0.75 μm, 1.0 μm, etc.) oxide layer (e.g., $SiO_2$) 308 may be grown under the silicon substrate layer 302, to serve as a masking layer in defining the structure of the reflector. In some embodiments, other photo resist (PR) materials, instead of oxide, may be used here for forming the masking layer.

Next, a photolithography (e.g., UV lithography) pattern transfer process may be performed, and a hard mask layer 310 with a predefined pattern may be then formed under silicon substrate layer 302, e.g., through reactive ion etching (RIE). The patterned hard mask 310 may correspond to the structure of the reflector. For example, the patterned hard mask 310 may include a circle in the center corresponding to the via hole of the reflector.

Next, a cone-shaped portion 312 of the reflector may be formed through one or more etching processes. In one example, a wet etching process (e.g., a tetramethyl-ammonium hydroxide (TMAH) etching process) may be conducted, although other etching processes are also possible. During the wet etching, the backside of the silicon substrate layer 302 may be gradually etched (e.g., by 363K TMAH) in many etch steps to obtain the cone-shaped portion 312 of the reflector.

Next, a via hole 314 may be formed by removing the center circle of the patterned hard mask (e.g., through lithography). The via hole 314 may be then obtained through another wet etching process, which may be similar to or different from the wet etching process used for obtaining the cone-shaped portion of the reflector. The as-formed reflector and the other remaining part of the SOI wafer may be then flipped over as shown in box 320 in FIG. 3. In some embodiments, the fabricated reflector may be further released from the SOI wafer by an oxide etch with an RIE process. The released reflector may be used to bond with a scanning MEMS mirror to form an omni-view peripheral scanning system. In some embodiments, the released reflector may be first mounted onto a proper anchor (e.g., anchor 116a/116b that is fabricated separately or simultaneously if a proper mask layer is prepared) before being bonded with the scanning MEMS mirror.

In some embodiments, the cone-shaped bottom portion of the fabricated reflector may be further coated with a reflecting material that has a high reflectivity. For instance, the coated reflecting material may have a reflectivity of 95% or higher, as previously described. In one example, the coating reflecting material may be polished anodized aluminum, mylar, silver, nickel, chromium, etc. In some embodiments, various processes, such as sputtering or evaporation, may be used for depositing reflective materials on the cone-shaped bottom portion of the fabricated reflector.

FIG. 4 provides an exemplary process 400 for fabricating the major structures of comb drive actuator-based platform (e.g., MEMS actuation platform) described in FIG. 2A. It is to be noted that, process 400 in FIG. 4 is merely for illustrative purposes, but does not necessarily reflect every detail in the actual fabrication of the disclosed comb drive actuator-based platform. For instance, certain comb drive shapes and structures illustrated in FIG. 2B and FIG. 2C are not necessarily detailed in FIG. 4.

To fabricate an actuator-based platform, a similar SOI wafer having a bottom silicon substrate layer (or handle layer) 402, a BOX layer 404 in the middle, and a top active primer quality silicon device layer (or device layer) 406 may be prepared. Depending on the configurations, the three layers 402, 404, and 406 may have different thicknesses. In one example, device layer 406 may have a thickness corresponding to the thickness of circular vertical comb drive structures (e.g., the thickness of movable comb 222a or stationary comb 220a in FIG. 2B if these two combs are fabricated through a separate process 400, or the thickness of the movable comb 222b and the stationary comb 220b in FIG. 2C).

In some embodiments, to form bonding pads for wire bonding (e.g., for bonding with cathode and anode configured for controlling movements of movable comb) of the formed comb drive actuator-based platform, a metal film 408 may be sputtered and patterned in bonding-pad shapes over certain locations of silicon device layer 406.

Next, a thin (e.g., 0.25 μm, 0.5 μm, 0.75 μm, 1.0 μm, etc.) thermal oxide (i.e., $SiO_2$) layer 410 may be grown over the top silicon device layer 406 as well as the bonding-pad shaped metal film 408, to serve as a masking layer in defining the main structure of the comb drive actuator-based platform. Similarly, another thermal oxide layer 412 may be also grown under silicon substrate layer 402 to serve as a masking layer, to make the backside process easier in later backside cavity etching. In some embodiments, other photo resist (PR) materials, instead of oxide, may be used here for respective layers 410 and 412 for forming patterned hard masks as described below.

Next, a photolithography pattern transfer process may be performed, and a hard mask layer 414 (which may be referred to as the first patterned hard mask) may be then prepared on silicon device layer 406, e.g., through RIE. The first patterned hard mask may correspond to a main structure illustrated in FIG. 2A for the comb drive actuator-based platform, except for certain components (e.g., certain anchors and spring beams) that may not be necessarily fabricated through process 400. In some embodiments, a second patterned hard mask 416 may be similarly performed on the backside (i.e., the bottom surface) under the silicon substrate layer 402. In some embodiments, each of the first patterned hard mask 414 or second patterned hard mask 416 may be a PR mask, which may be made from a light-sensitive material used in processes such as photolithography and photoengraving, to form a patterned coating on a surface.

Next, the comb drive actuator-based platform main structure 418 (i.e., a circular vertical comb drive actuator-based platform shown in FIG. 2A) may be formed from the front side (i.e., top side in FIG. 4) of silicon device layer 406 of the SOI wafer through an etching process. In one example, a deep-reactive ion etching (DRIE) technology may be used for etching, although other appropriate etching processes are also contemplated. During the deep-reactive ion etching, $C_4F_8$, $SF_6$, and $O_2$ may be provided in an inductively coupled plasma (ICP) system, in which $C_4F_8$ may be first used as the passivation precursor to protect the side wall, then $SF_6/O_2$ may serve as the etching gases for silicon etching downward. In some embodiments, the silicon substrate layer 402 with the second patterned hard mask 416 may be similarly etched through the DRIE etching, to form a backside cavity 420.

Next, BOX layer 404 may be etched away in order to release the fabricated comb drive actuator-based platform main structure, as indicated by box 422. In some embodiments, hydrofluoric acid (HF) vapor may be used to etch away buried oxide layer 404, while other etching processes may be also possible. It is to be noted, although not shown in the exact detail, the released comb drive actuator-based platform main structure may include the main components of circular vertical comb drive actuators-based platform illustrated in FIG. 2A.

It is to be noted that, when fabricating comb drive actuator-based platform main structure as illustrated in box 422, if comb drive actuators shown in FIG. 2C are included in the to-be-fabricated comb drive actuator-based platform, a single process 400 described above may be used to fabricate comb drive actuator-based platform main structure. However, if comb drive actuators shown in FIG. 2B are included in the to-be-fabricated comb drive actuator-based platform, the stationary combs and the movable combs may be fabricated separately through a same (e.g., by placing stationary combs and movable combs in different locations or different layers) or a different process 400, which are then aligned together to form the comb drive actuator-based platform main structure.

In some embodiments, a scanning mirror 104 may be integrated into the released comb drive actuator-based platform main structure. For instance, a scanning mirror 104 may be integrated onto the central circle of the comb drive actuator-based platform main structure via a micro-assembly process under the assistance of a microscope for alignment and an epoxy adhesive for fixing. In some embodiments, a scanning mirror without the coating surface may be also constructed with the comb drive actuator-based platform main structure in the above process 400. After the fabrication through process 400, the scanning mirror may be then coated with reflecting materials with high reflectivity. In some embodiments, the comb drive actuator-based platform main structure may be further aligned with the fabricated reflector to form an omni-view peripheral scanning system, as described below in FIG. 5.

FIG. 5 illustrates a schematic diagram of an exemplary process for bonding a fabricated reflector with a comb drive actuator-based platform to form an omni-view peripheral scanning system, according to embodiments of the disclosure. For instance, the fabricated reflector in box 320 may bond to the fabricated comb drive actuator-based platform in box 422 to form the omni-view peripheral scanning system 100. It is to be noted that the illustrated reflector in box 320 and the comb drive actuator-based platform in box 422 in FIG. 5 are merely for illustrative purposes, but do not limit the actual structure of the reflector and the comb drive actuator-based platform used in an omni-view peripheral scanning system (e.g., omni-view peripheral scanning system shown in FIG. 1). In addition, certain SOI layers shown in the illustrated reflector in box 320 and comb drive actuator-based platform in box 422 may not necessarily present in the actual reflector and/or comb-drive actuator-based platform. For one instance, for the illustrated reflector in box 320, in order to allow the peripheral scanning, the surrounding parts on the left and right side of the reflector in box 320 may be removed to allow the laser beams to be directed towards the environment. Therefore, to allow the reflector to be bonded with the comb drive actuator-based platform while also allowing the laser beams to pass through, certain transparent glass may be placed surrounding the reflector, where the glass may be bonded with the anchors that hold the reflector and the comb drive actuator-based platform.

In some embodiments, certain other components, such as certain sensors, wires, and/or controlling components may be further added or connected to the bonded reflector and the comb drive actuator-based platform main structures, to allow control of the comb drive actuator-based platform in a scanning process.

It is to be noted that the above-described processes 300-500 are merely for illustrative purposes and not for limitation. Many different processes other than the above described may be applied to microfabricate the disclosed omni-view peripheral scanning system.

Figure 6:
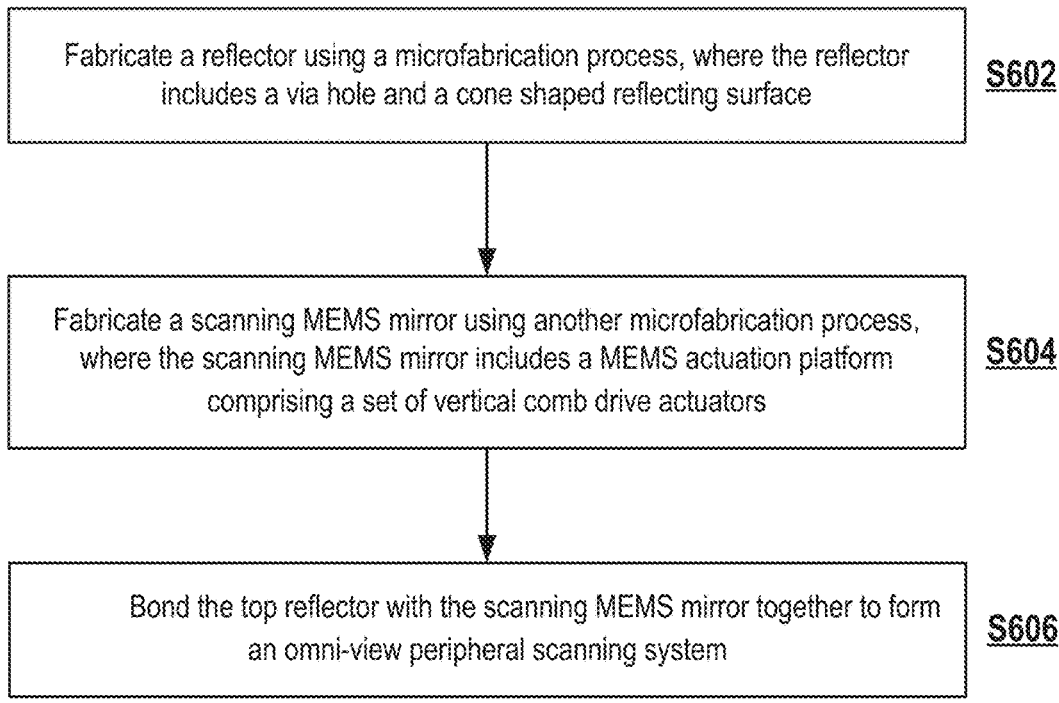
FIG. 6 is a flow chart of an exemplary method for microfabricating an omni-view peripheral scanning system, according to embodiments of the disclosure.

FIG. 6 is a flow chart of an exemplary method 600 for making an omni-view peripheral scanning system, according to embodiments of the disclosure. In some embodiments, method 600 may include steps S602-S606. It is to be appreciated that some of the steps may be optional. Further, some of the steps may be performed simultaneously, or in a different order than that shown in FIG. 6.

In step 602, a reflector may be fabricated through a microfabrication process. The fabricated reflector may include a top column portion, a cone-shaped bottom portion, and a via hole across the top column portion and the cone-shaped bottom portion, as illustrated in FIG. 1. In some embodiments, the reflector may be fabricated according to process 300 illustrated in FIG. 3. In some embodiments, the reflector may be fabricated through other different processes. For instance, instead of using an etching process on a silicon substrate layer, the reflector may be fabricated through a proper molding process, through a proper hardening process, or through any other processes for making a structure containing a top column portion, a cone-shaped bottom portion, and a via hole as illustrated in FIG. 1.

In step 604, a scanning MEMS mirror may be constructed. In some embodiments, to construct the scanning MEMS mirror, a comb drive actuator-based MEMS actuation platform and a scanning mirror may be first fabricated independently and then bonded together. Alternatively, the scanning mirror structure without coating surface may be fabricated simultaneously with the comb drive actuator-based MEMS actuation platform and a scanning mirror may be first fabricated independently and then bonded together. The as-fabricated scanning mirror may be then coated with reflective materials to form the actual scanning mirror. In some embodiments, other different processes may be applied to construct a scanning mirror that has a shape and size fit to a fabricated MEMS actuation platform.

To construct the MEMS actuation platform, one or more microfabrication processes 400 illustrated in FIG. 4 may be applied. For instance, a first patterned hard mask corresponding to a circular vertical comb drive shown in FIG. 2B may be used to fabricate the circular vertical comb drive actuator shown in FIG. 2B. As previously described, the movable comb and the stationary comb for the circular vertical comb drive actuator shown in FIG. 2B may be microfabricated separately, which are then aligned and assembled after their fabrication. For instance, process 400 may be performed twice, where each process may be applied to microfabricate a respective movable comb 222a or stationary comb 220a. The independently fabricated movable comb 222a and the stationary comb 220a may be then assembled into a circular vertical comb drive actuator. Alternatively, movable comb 222a and stationary comb 220a may be fabricated in a same microfabrication process, but they are placed at different locations or in different layers during a same microfabrication process 400.

In some embodiments, a first patterned hard mask corresponding to a circular vertical comb drive shown in FIG. 2C may be used to fabricate a MEMS actuation platform containing vertical comb drive actuators as shown in FIG. 2C. A single process 400 may be applied to fabricate both the movable combs 222b and the stationary combs 220b shown in FIG. 2C. The first patterned hard mask may match the shape and size of the stationary combs 220b and the movable combs 222b illustrated in FIG. 2C, as well as other components of the MEMS actuation platform.

In some embodiments, to form the MEMS actuation platform, three or more assembled circular vertical comb drive actuators may be then aligned and/or integrated into a platform anchor 120 if they are fabricated separately, to form the MEMS actuation platform. In some embodiments, if not bonded before, anodes and cathodes may be further bonded to the movable combs and the stationary combs, for application of voltage differentials to the circular vertical comb drive actuators. In some embodiments, one or more controllers and/or one or more suspension beams may be further integrated into or connected to the constructed MEMS actuation platform.

In some embodiments, after the MEMS actuation platform is eventually constructed, the fabricated scanning mirror may be fixed to the corresponding beams of the comb drive actuators if it is fabricated separately, thereby forming a scanning MEMS mirror as shown in FIG. 2A.

In step 606, the scanning MEMS mirror may be bonded with the fabricated reflector to form the omni-view peripheral scanning system. The reflector may be disposed on top of the scanning MEMS mirror such that the scanning mirror included in the scanning MEMS mirror faces the cone-shaped bottom portion of the reflector. Accordingly, a laser beam incident on the scanning mirror may be reflected towards the reflector on top of the scanning mirror. When the scanning mirror is tilted to certain normal directions, the reflected laser beam may reach different locations of the cone-shaped bottom portion. When the scanning mirror is controlled to tilt following a certain pattern during a scanning process, the laser beams reflected by the tilted scanning mirror may follow a certain pattern (e.g., a spiral pattern) when reaching the cone-shaped bottom portion. The cone-shaped bottom portion may include a reflecting surface that subsequentially reflects the laser beams towards the environment in a pattern that matches the spiral pattern reflected by the scanning mirror, thereby achieving up to a 360-degree horizontal field of view by the disclosed omni-view peripheral scanning system.

Although the disclosure is made using a LiDAR system as an example, the disclosed embodiments may be adapted and implemented to other types of optical sensing systems that use receivers to receive optical signals not limited to laser beams. For example, the embodiments may be readily adapted for optical imaging systems or radar detection systems that use electromagnetic waves to scan objects.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

What is claimed is:

1. A method for making an omni-view peripheral scanning system, the method comprising:
fabricating a reflector using a first micro-fabrication process, wherein the reflector comprises a cone-shaped bottom portion, and a via hole across the cone-shaped bottom portion;
constructing a scanning micro-electro-mechanical systems (MEMS) mirror, wherein the scanning MEMS mirror comprises a MEMS actuation platform and a scanning mirror supported by the MEMS actuation platform; and
bonding the reflector on top of the scanning MEMS mirror such that the scanning MEMS mirror faces the cone-shaped bottom portion to form the omni-view peripheral scanning system.

2. The method of claim 1, wherein fabricating the reflector using the first micro-fabrication process comprises:
preparing a silicon on an insulator (SOI) wafer containing a silicon device layer, a buried oxide (BOX) layer, and a silicon handle layer;
applying a patterned hard mask over the silicon device layer; and
etching the silicon device layer with the patterned hard mask to form the reflector comprising the cone-shaped bottom portion, and the via hole across the cone-shaped bottom portion.

3. The method of claim 2, wherein etching the silicon device layer with the patterned hard mask further comprises:
etching the via hole along a central axis of the cone-shaped bottom portion.

4. The method of claim 2, wherein etching the silicon device layer with the patterned hard mask further comprises:
etching the via hole to a predefined shape and size.

5. The method of claim 2, wherein etching the silicon device layer with the patterned hard mask further comprises:
etching a cone portion of the cone-shaped bottom portion to a predefined apex angle and height.

6. The method of claim 1, wherein fabricating the reflector using the first micro-fabrication process further comprises:
coating the cone-shaped bottom portion with a layer of high-reflective material.

7. The method of claim 6, wherein the high-reflective material is coated onto the cone-shaped bottom portion with one of a sputtering or evaporation process.

8. The method of claim 1, wherein constructing the scanning MEMS mirror comprises:

fabricating the MEMS actuation platform using a second micro-fabrication process;
fabricating the scanning mirror with a predefined shape and size; and
fixing the scanning mirror to the MEMS actuation platform to form the scanning MEMS mirror.

9. The method of claim 8, wherein fabricating the MEMS actuation platform using the second micro-fabrication process:
preparing an SOI wafer containing a silicon device layer, a BOX layer, and a silicon handle layer;
applying a first patterned hard mask over the silicon device layer and a second patterned hard mask under the silicon handle layer;
etching the silicon device layer with the first patterned hard mask for forming a front side MEMS actuation platform;
etching the silicon handle wafer with the second patterned hard mask to create a backside cavity; and
removing the BOX layer to release the MEMS actuation platform.

10. The method of claim 9, wherein etching the silicon device layer with the first patterned hard mask for forming the front side MEMS actuation platform comprises:
etching the silicon device layer with the first patterned hard mask to form a plurality of comb drive actuators.

11. The method of claim 10, wherein the plurality of comb drive actuators comprises three or more circular vertical comb drive actuators.

12. The method of claim 10, wherein etching the silicon device layer with the first patterned hard mask for forming the front side MEMS actuation platform further comprises:
etching the silicon device layer with the first patterned hard mask to allow the plurality of comb drive actuators to be formed around a central circle.

13. The method of claim 12, wherein the central circle surrounded by the plurality of comb drive actuators matches the predefined shape and size of the scanning mirror.

14. The method of claim 10, wherein each of the plurality of comb drive actuators comprises a stationary comb and a movable comb that is configured to move vertically towards or away from the stationary comb.

15. The method of claim 14, wherein each movable comb comprises a circular arm.

16. The method of claim 15, wherein each circular arm further comprises a small beam extending towards a center of the circular arm.

17. The method of claim 16, wherein fixing the scanning mirror to the MEMS actuation platform comprises fixing the scanning mirror to the small beam of each circular arm of the plurality of comb drive actuators.

18. The method of claim 14, further comprising:
electrically connecting each of the stationary comb and the movable comb to one of a cathode and an anode.

19. A method for making an optical sensing system with an omni-view peripheral scanning system, comprising:
constructing the omni-view peripheral scanning system comprising a reflector bonded on top of a scanning MEMS mirror, wherein the scanning MEMS mirror comprises a MEMS actuation platform and a scanning mirror supported by the MEMS actuation platform, and wherein the reflector comprises a cone-shaped bottom portion, and a via hole across the cone-shaped bottom portion; and
coupling the MEMS actuation platform to a controller for controlling a voltage differential to be applied to each of a plurality of comb drive actuators in the MEMS actuation platform.

20. The method of claim 19, wherein the controller is configured to control voltage differentials applied to two adjacent comb drive actuators to have a phase difference.

* * * * *